United States Patent [19]

Sahakian

[11] Patent Number: 4,890,154
[45] Date of Patent: Dec. 26, 1989

[54] SEMICONDUCTOR PACKAGE PROFILE
[75] Inventor: Vahak K. Sahakian, Los Altos Hills, Calif.
[73] Assignee: LSI Logic Corporation, Milpitas, Calif.
[21] Appl. No.: 163,342
[22] Filed: Mar. 2, 1988
[51] Int. Cl.$^4$ ................... H01L 23/30; H01L 23/04
[52] U.S. Cl. ........................................ 357/74; 357/68
[58] Field of Search ............... 357/70, 74, 72, 68; 174/52 FP

[56] References Cited

U.S. PATENT DOCUMENTS

| 4,617,585 | 10/1986 | Yasui | 357/70 |
| 4,642,670 | 2/1987 | Striny | 357/72 |
| 4,698,660 | 10/1987 | Kubota et al. | 357/70 |

FOREIGN PATENT DOCUMENTS 0051850  3/1986  Japan ........................... 357/72

Primary Examiner—Rolf Hille
Assistant Examiner—S. V. Clark
Attorney, Agent, or Firm—Skjerven, Morrill, MacPherson, Franklin & Friel

[57] ABSTRACT

An improved package with J-leads for an integrated circuit is obtained by modifying the package profile so as to relieve the bottom edge to provide space for insertion of a rod to be used as a tool to shape or reshape the curved part of the leads. This permits both easier original manufacturing and faster and better reshaping of bent leads.

6 Claims, 1 Drawing Sheet

SEMICONDUCTOR PACKAGE PROFILE

FIELD OF THE INVENTION

This invention relates to the shape of an integrated circuit package. More particularly, it is directed to a semiconductor package profile for packages utilizing multiple metallic leads that are "J" shaped, in order to allow improved shaping of the leads and re-shaping them.

BACKGROUND OF THE INVENTION

A very common package for semiconductor devices is the leaded chip carrier. JEDEC, a semiconductor standards group, has established standard dimensions for plastic and ceramic dual-in-line packages (DIP's), plastic leaded chip carriers (PLCC's), and ceramic leaded chip carriers (CLCC's).

These packages all use "J" leads, which extend from a midpoint of the sides of the package and are bent downwardly around the package bottom edge and extend inward to form the bottom of the J. The curved bottom hereinafter is called the lead "tail".

It is the tail that is solder mounted to traces or conductive pads of a printed circuit board. A bent or misshapen tail will not make the proper contact with its trace. It is critical therefore that the tails of all leads in a package are substantially coplanar. The tails under current manufacturing processes are formed "blind" without anvils to help shape them. FIG. 1 shows a prior art typical package and J leads. Consequently if any of the leads are bent out of shape due to mishandling, they cannot be reformed easily.

The common current practice is to adjust the leads manually with pliers or tweezers. This is costly due to its slowness and also not very effective.

SUMMARY OF THE INVENTION

By contour relieving the bottom edges of the package in a negative radiused manner, space can be provided between the lead tails and the package for insertion of a rod to act as a tool during shaping and reshaping of the leads. This improvement in the package shape ensures that all the leads can be bent so that they are coplanar, are of the specified dimensions, allows automated lead reshaping, and improves mechanical and electrical contact to the printed circuit board or the socket. This results in faster processing, better yields, and better quality semiconductor devices.

DETAILED DESCRIPTION

Figure 1:
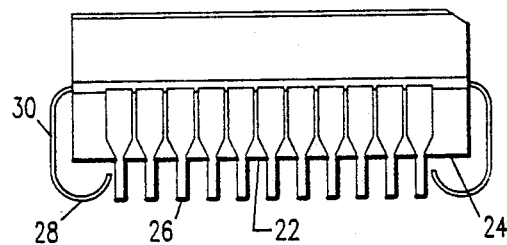
FIG. 1 shows a side view of a prior art leaded chip carrier with J leads.

FIG. 1 shows a side view of a typical prior art PLCC integrated circuit package 20 having a flat bottom surface 22 surrounded by peripheral edge portion 24 between which J-leads 26 are bent and form the J-lead tails 28. The downward lead portion 30 is essentially vertical with respect to the horizontal package.

Figure 2:
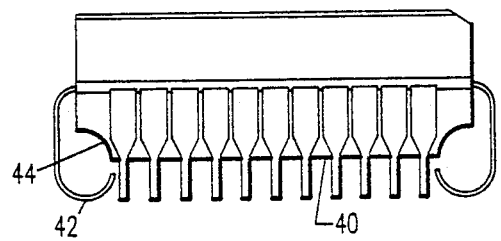
FIG. 2 shows a side view of the present invention.

FIG. 2 shows a side view of the present invention, which is an improved package. The improvement consists of modifying the package 38 shape at the bottom edge 40 so as to continue the radius of the tail 42 of the J-lead partly into the package bottom profile 44. This radius is 0.787 mm for the standard JEDEC J-lead, in one embodiment. This improvement is easily accomplished when the packages are molded from plastic or pressed ceramic powder. The relief of the bottom edge 40 of the package (carried out along all sides) allows insertion of a tool consisting of a metal rod 1/16" in diameter in the round "tunnel" between the package and the lead tails on each side of the package. This rod acts as an anvil (or support means) for the leads to be formed against during shaping when the packages are first manufactured, or as a prying or reforming tool during any necessary later shaping, either at the semiconductor manufacturer or later on in the field. The rod need not be completely round, so long as it is round where it contacts the leads and also conforms to the package shape.

Figure 3:
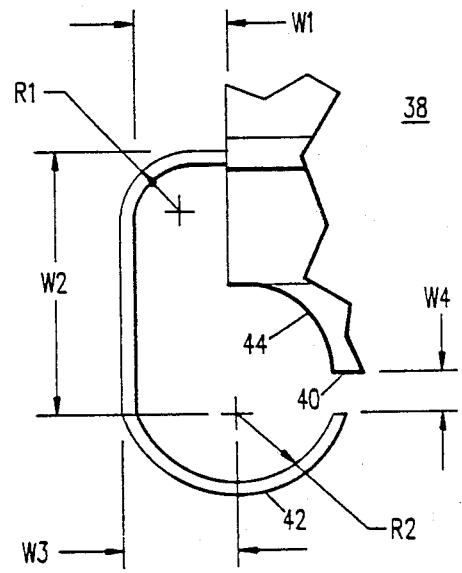
FIG. 3 shows an enlarged side view of the package edge and J-lead of the present invention.

FIG. 3 shows an enlarged view of part of FIG. 2, with typical dimensions as follows first in millimeters and then in inches in parentheses: R1 is 0.381 mm (0.015"); R2 is 0.787 mm (0.031"); W1 is 0.254 mm (0.010"); W2 is 1.701 mm (0.067"); W3 is 0.939 mm (0.037"); W4 is 0.076 mm (0.003"). Note that in this embodiment most of the area relieved is an arc in shape with a radius of 0.787 mm, the same radius as the inside diameter of the tail of the J lead. These dimensions are the JEDEC standards.

Also, note that this modification to the package outline is permitted by the JEDEC specification for leaded chip carriers, and so will not impact adversely on package function or compatibility.

The above description of the preferred embodiment of this invention is intended to be illustrative and not limiting. Other embodiments of this invention will be obvious to those skilled in the art in view of the above disclosure.

I claim:

1. An integrated circuit package for use with electrical leads extending from a surface of said package, said package having opposed top and bottom surfaces and a peripheral surface and wherein said leads each have a first portion extending from the peripheral surface of the package and a second, arc-shaped, portion extending to a position adjacent to said bottom surface of said package;
   wherein the peripheral and bottom surfaces are connected by an arc-shaped surface arched inwardly of the body of said package;
   and wherein the arc-shaped portions of the leads and the arc-shaped surface share a common radius center point.

2. The device of claim 1, wherein said package is a leaded chip carrier.

3. The device of claim 1, wherein said package is a leaded dual-in-line package.

4. The device of claim 1, for use with electrical leads that are J-shaped.

5. An integrated circuit package having electrical leads extending from a surface of said package, said package comprising opposed top and bottom surfaces and a peripheral surface and wherein said leads each have a first portion extending from the peripheral surface of the package and a second, arc-shaped, portion extending to a position adjacent to said bottom surface of said package; wherein the peripheral and bottom surfaces are connected by an arc-shaped surface arched inwardly of the body of said package;

and wherein the arc-shaped portions of the leads and the arc-shaped surface share a common radius center point.

6. An integrated circuit package having electrical leads extending from a surface of the package, said package comprising opposed top and bottom surfaces and a peripheral surface, and wherein said leads each have a first portion extending from the peripheral surface of the package and a second curved portion extending to a position adjacent to said bottom surface of said package;

wherein the peripheral and bottom surfaces are connected by a curved surface arched inwardly of the body of said package, and wherein the curved portions of the leads and the curved surface define a void elliptical in shape.

* * * * *